(12) United States Patent
Tsuchiya et al.

(10) Patent No.: US 9,559,678 B2
(45) Date of Patent: Jan. 31, 2017

(54) GENERATION OF ANALOG SIGNAL BASED ON ONE-BIT SIGNAL

(71) Applicant: YAMAHA CORPORATION, Hamamatsu-shi, Shizuoka-Ken (JP)

(72) Inventors: Hiroyuki Tsuchiya, Hamamatsu (JP); Eiichi Takeishi, Hamamatsu (JP)

(73) Assignee: YAMAHA CORPORATION, Hamamatsu-shi (JP)

( * ) Notice: Subject to any disclaimer, the term of this patent is extended or adjusted under 35 U.S.C. 154(b) by 0 days.

(21) Appl. No.: 14/978,122

(22) Filed: Dec. 22, 2015

(65) Prior Publication Data

US 2016/0191070 A1   Jun. 30, 2016

(30) Foreign Application Priority Data

Dec. 25, 2014   (JP) .................................. 2014-263636

(51) Int. Cl.
| | |
|---|---|
| *H03M 1/66* | (2006.01) |
| *H03K 7/08* | (2006.01) |
| *H03K 9/08* | (2006.01) |
| *H03K 3/017* | (2006.01) |

(52) U.S. Cl.
CPC ................ *H03K 7/08* (2013.01); *H03K 3/017* (2013.01); *H03K 9/08* (2013.01); *H03M 1/66* (2013.01)

(58) Field of Classification Search
CPC ....... H03M 1/0863; H03M 1/001; H03K 7/08; H03K 9/08; H03K 3/017
USPC .................... 341/53, 110, 144, 152
See application file for complete search history.

(56) References Cited

U.S. PATENT DOCUMENTS

| | | | |
|---|---|---|---|
| 6,111,532 A | 8/2000 | Hirano et al. | |
| 6,720,825 B2* | 4/2004 | Hansen | H03F 1/305 330/10 |
| 7,439,440 B2* | 10/2008 | Hsu | H03M 3/388 330/10 |

(Continued)

FOREIGN PATENT DOCUMENTS

| | | |
|---|---|---|
| JP | 11122112 A | 4/1999 |
| JP | 2006080685 A | 3/2006 |

(Continued)

OTHER PUBLICATIONS

Notification of Reasons for Refusal issued in Japanese Appln. No. 2014-263636, mailed Nov. 8, 2016. Machine English translation provided.

*Primary Examiner* — Brian Young
(74) *Attorney, Agent, or Firm* — Rossi, Kimms & McDowell LLP

(57) ABSTRACT

An analog signal generation apparatus includes: a converter which converts an input waveform signal into a one-bit signal; a control section which, in response to a mute-off instruction, controls a pulse width time length of the one-bit signal, output from the converter, to progressively increase from zero to a target value; and a filter which converts the one-bit signal, controlled by the control section, into an analog signal. The control section may further perform, in response to a mute-on instruction, control for progressively decreasing the pulse width time length of the one-bit signal, output from the converter, from a current value to zero. The mute-off instruction is given in response to turning-on of a power supply, and the mute-on instruction is given in response to a power supply OFF instruction.

21 Claims, 6 Drawing Sheets

(56) References Cited

U.S. PATENT DOCUMENTS

| | | | |
|---|---|---|---|
| 8,093,951 B1 * | 1/2012 | Zhang | H03F 3/217 |
| | | | 330/251 |
| 8,362,832 B2 * | 1/2013 | Kim | H03G 3/007 |
| | | | 330/10 |
| 8,841,894 B1 * | 9/2014 | Naraghi | H02M 1/38 |
| | | | 323/282 |
| 2006/0262843 A1 | 11/2006 | Kim et al. | |
| 2009/0302942 A1 | 12/2009 | Ido et al. | |

FOREIGN PATENT DOCUMENTS

| | | | |
|---|---|---|---|
| JP | 2008263519 A | | 10/2008 |
| WO | 2005091498 A1 | | 9/2005 |

* cited by examiner

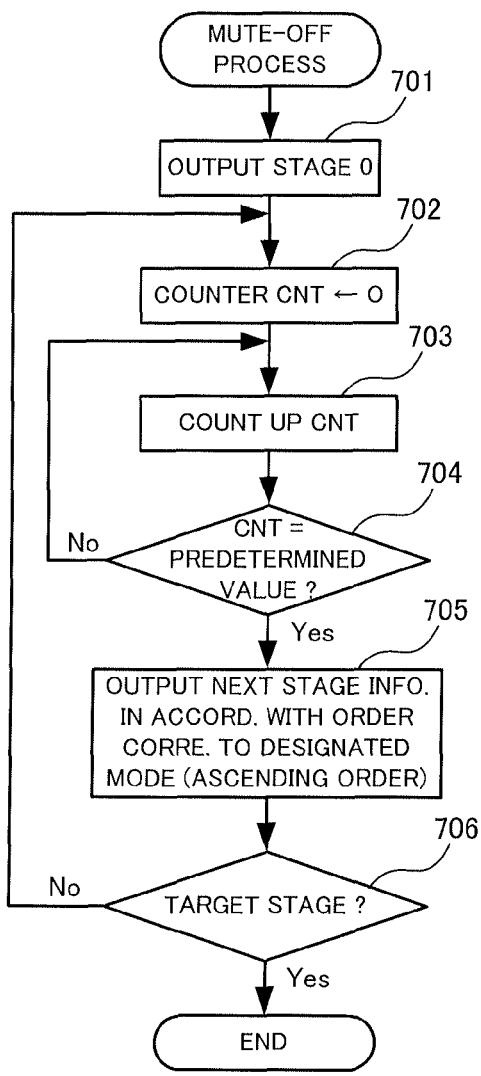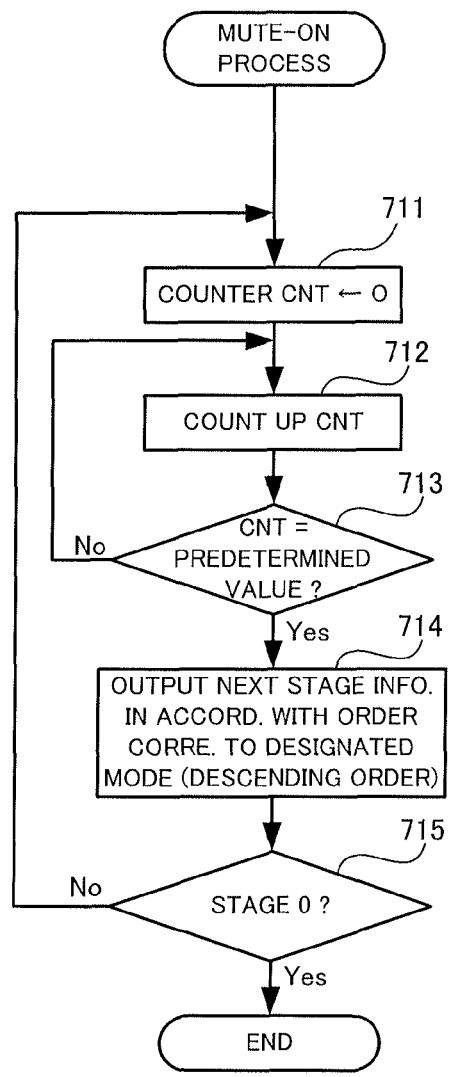
F I G. 7 A
F I G. 7 B

GENERATION OF ANALOG SIGNAL BASED ON ONE-BIT SIGNAL

BACKGROUND

The present invention relates to techniques for generating an analogue signal based on a one-bit signal, and more particularly to a technique which is designed to suppress transitory noise occurring when a shift is made to a silent state at the time of turning on/off of a power supply, at the time of resetting or the like or when the silent state ends and which is applicable to apparatus, such as electronic musical instruments, for generating an audio waveform signal, digital-to-analog converters, etc.

Today, one-bit digital-to-analog (DA) converters are used extensively to convert a one-bit digital audio signal, generated or processed in accordance with PWM (Pulse Width Modulation), PDM (Pulse Density Modulation) or the like, into an analogue audio signal and output the converted analogue audio signal. Amplitude value of a raw waveform in a one-bit audio signal input to such a one-bit DA converter is represented by density of pulses, the one-bit DA converter generates an analog signal by filtering the input one-bit audio signal by means of a lowpass filter (LPF). In recent years, there has been known a technique which, in generating a one-bit digital signal from a raw waveform signal by use of a $\Delta\Sigma$ modulator, oversamples a digital audio signal (raw waveform) at a high sampling frequency to cause quantization noise to distribute over wide frequency bands, then performs noise shaping, by means of the $\Delta\Sigma$ modulator, for shaping the quantization noise such that the level of the quantization noise decreases in a low frequency band and increase in a high frequency band to thereby reduce the noise level in an audible frequency range (see, for example, Japanese Patent Application Laid-open Publication No. HEI-11-122112).

Also known is a DA conversion technique which generates a single analogue signal by use of two-phase one-bit signals consisting of positive-phase and reverse-phase signals (i.e., two differential signals or balanced signals) (see, for example, Japanese Patent Application Laid-open Publication No. 2006-80685). More specifically, according to this technique, the above-mentioned $\Delta\Sigma$ modulator is applied to a one-bit switching amplifier to generate two-phase differential signals from a one-bit digital signal that is an output of the $\Delta\Sigma$ modulator, and then an analog signal is generated from the differential signals by means of a power switch and an LPF. It has also been conventionally known to implement the $\Delta\Sigma$ modulator by a full differential circuit.

A one-bit signal in the aforementioned one-bit DA converter represents peak values of an original waveform by density of a pulse train, and it is a signal where, in a silent state, timing to output a pulse and timing to not output a pulse occurs alternately at an equal ratio (i.e., with a duty cycle of 50%). Normally, as a power supply to an electronic musical instrument, audio equipment or other apparatus is turned on from an off state, energization of the apparatus is started from a state where the apparatus is not energized at all. At that time, operation of a DA conversion system provided in the apparatus is initially started in a silent state. Thus, when shifting to the silent state in response to the turning-on of the power supply (i.e., power supply ON), the DA conversion system suddenly shifts from the non-energized state to a state in which there is output a one-bit signal where timing to output a pulse and timing to not output a pulse occurs alternately at an equal ratio, so that transitory noise would undesirably occur. When the DA conversion system shuts down to the power supply OFF state too, there would sometimes occur the problem of transitory noise. Namely, when the silent state ends in response to the power supply OFF, the one-bit signal where the timing to output a pulse and the timing to not output a pulse has so far occurred alternately at an equal ratio is suddenly shut down, so that transitory noise would arise.

SUMMARY OF THE INVENTION

In view of the foregoing prior art problems, it is an object of the present invention to provide a technique which is designed to generate an analogue signal based on a one-bit signal and which can suppress transitory noise that may occur when a shift is made to a silent state in response to turning on/off of a power supply, resetting or the like, when a silent state ends, when there has been a sudden variation in a pulse width of the one-bit signal, etc.

In order to accomplish the above-mentioned object, the present invention provides an improved analog signal generation apparatus, which comprises: a converter configured to convert an input waveform signal into a one-bit signal; a control section configured to, in response to a mute-off instruction, control a pulse width time length of the one-bit signal, output from the converter, to progressively increase from zero to a target value; and a filter configured to convert the one-bit signal, controlled by the control section, into an analog signal.

When a power supply has been turned on, the converter operates to output a one-bit signal corresponding to a silent state because, generally, there is no input waveform signal (i.e., the input waveform signal is of a 0 (zero) level) at that time. The one-bit signal corresponding to the silent state is, for example, a pulse signal of a duty cycle of 50% and thus has a relatively great pulse width time length, which would therefore would become a factor that transiently generates click noise at the time of a first rise. However, according to the present invention, control is performed, in response to the mute-off instruction, for progressively increasing the pulse width time length of the one-bit signal, output from the converter, from zero to the target value. Thus, by the mute-off instruction being given upon turning-on of the power supply (i.e., power supply ON), the pulse width time length of the one-bit signal can be controlled to progressively increase from zero to the target value instead of immediately rising up to the target value corresponding to the silent state. In this way, the present invention can suppress transitory noise from occurring upon the power supply ON.

Note that the mute-off instruction may be given other than upon power supply ON, such as when the one-bit signal output from the converter is to be caused to progressively rise. Thus, even when the pulse width time length of the one-bit signal output from the converter varies in such a manner as to rapidly increase, the present invention can suppress occurrence of transitory noise by the control section controlling the pulse width time length of the one-bit signal to progressively increase from zero to the target value as noted above.

According to another aspect of the present invention, the present invention provides an improved analog signal generation apparatus, which comprises: a converter which converts an input waveform signal into a one-bit signal; a control section which, in response to a mute-on instruction, controls a pulse width time length of the one-bit signal, output from the converter, to progressively decrease from a current value to zero; and a filter which converts the one-bit signal, controlled by the control section, into an analog signal.

If a current state is the silent state when the power supply is to be turned off, the converter is outputting a one-bit signal corresponding to the silent state (e.g., pulse signal of a duty cycle of 50%) because, generally, there is no input waveform signal (i.e., the input waveform signal is of a 0 level). Because the one-bit signal corresponding to the silent state has a relatively great pulse width time length as noted above, such a one-bit signal would transiently generate click noise at the time of a first rise if the power supply is turned off immediately. However, according to the present invention, control is performed, in response to the mute-on instruction, for progressively decreasing the pulse width time length of the one-bit signal, output from the converter, from a current value to zero. Thus, by the mute-on instruction being given when the power supply is to be turned off, the pulse width time length of the one-bit signal can be controlled to progressively decrease from the current value (i.e., value corresponding to the silent state if the current state is the silent state) to zero instead of immediately falling down to zero. In this way, the present invention can suppress transitory noise from occurring upon turning-off of the power supply (i.e., power supply OFF).

The mute-on instruction may be given other than when the power supply is to be turned off, such as when the one-bit signal output from the converter is to be caused to progressively fall. Thus, even when the pulse width time length of the one-bit signal output from the converter varies in such a manner as to rapidly decrease, the present invention can suppress occurrence of transitory noise by the control section controlling the pulse width time length of the one-bit signal to progressively decrease from the current value to zero.

One embodiment of the analog signal generation apparatus may further comprise a differentiating section configured to convert the one-bit signal, output from the converter, into differential signals consisting of a positive-phase signal and a reverse-phase signal. Further, the control section may progressively increase, in accordance with the mute-off instruction, a pulse width time length of each of the differential signals from zero to the target value and may progressively decrease, in accordance with the mute-on instruction, the pulse width time length of each of the differential signals from a current value to zero.

The present invention may be constructed and implemented not only as the apparatus invention discussed above but also as a method invention. Also, the present invention may be arranged and implemented as a software program for execution by a processor, such as a computer or DSP, as well as a non-transitory computer-readable storage medium storing such a software program.

The following will describe embodiments of the present invention, but it should be appreciated that the present invention is not limited to the described embodiments and various modifications of the invention are also possible without departing from the basic principles. The scope of the present invention is therefore to be determined solely by the appended claims.

BRIEF DESCRIPTION OF THE DRAWINGS

Certain preferred embodiments of the present invention will hereinafter be described in detail, by way of example only, with reference to the accompanying drawings, in which:

FIG. 7A is a flow chart showing an example of a mute-off process performed in response to power supply ON;

FIG. 7B is a flow chart showing an example of a mute-on process performed in response to a power shutdown instruction;

DETAILED DESCRIPTION

Figure 1:
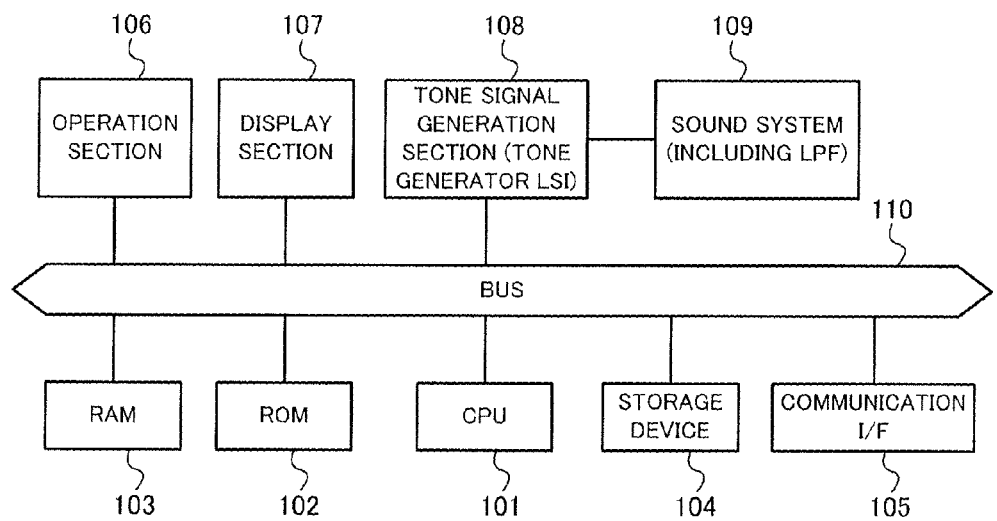
FIG. 1 is a block diagram showing an example hardware setup of an electronic musical instrument to which is applied an embodiment of an analog signal generation apparatus of the present invention.

FIG. 1 is a block diagram showing an example hardware setup of an electronic musical instrument to which is applied an embodiment of an analog signal generation apparatus of the present invention that uses differential signals. A central processing device (CPU) 101 controls operation of the entire electronic musical instrument by executing control programs stored in a ROM 102 and a RAM 103. The ROM (Read-Only Memory) 102 is a non-volatile memory storing a BIOS (Basic Input/Output System) responsible for a star-up routine responsive to power supply ON (i.e., turning-on of a power supply) and low-level I/O processing, control programs for execution by the CPU 101 and various data. The RAM (Random Access Memory) 103 is a volatile memory for use as various types of working areas. Various programs for execution by the CPU 101, waveform sample data to be used by a tone signal generation section 108 for generating tone signals, etc. are stored in a storage device 104. A communication interface (I/F) 105 is an interface for connecting various external equipment to the electronic musical instrument.

The operation section 106 includes, among other things, a performance operator unit, such as a keyboard, operable by a user to carry out performance operations, and various switches provided on an outside operation panel for the user to give various instructions to the electronic musical instrument. A display section 107 displays various information on the basis of instructions given from the CPU 101. The tone signal generation section 108 performs tone generation processing in accordance with an instruction given from the CPU 101 to thereby output a digital tone signal. The tone signal generation section 108 is implemented by a tone generator LSI (Large-Scale Integrated Circuit) that is a single semiconductor chip. A sound system 109 converts a digital tone signal output from the tone signal generation section 108 into an analog signal and audibly outputs the converted analog signal.

Figure 2:
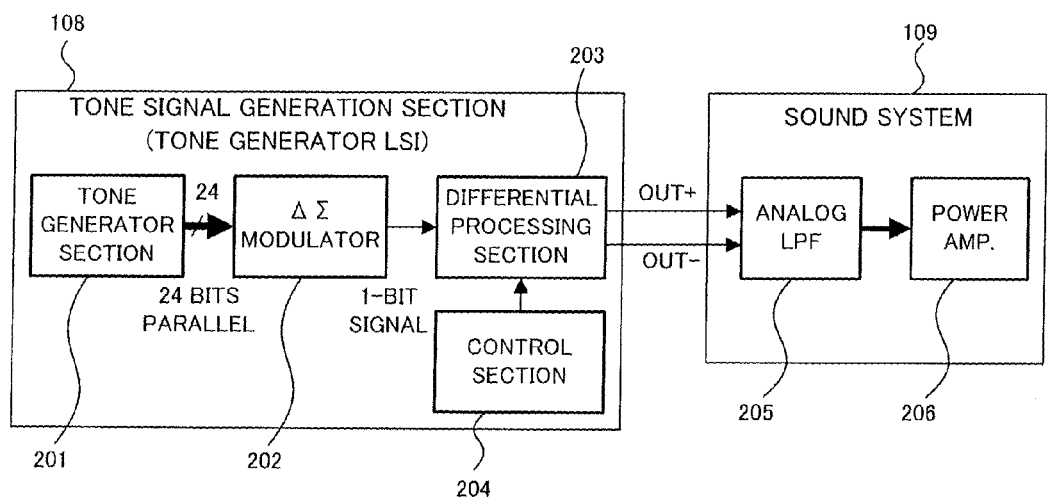
FIG. 2 is a block diagram showing an example inner construction of a tone signal generation section and a sound system shown in FIG. 1.

FIG. 2 is a block diagram showing inner constructions of the tone signal generation section 108 and the sound system 109. A tone generator section 201 generates a digital tone signal (waveform signal) on the basis of an instruction given from the CPU 101. Here, a sampling frequency is indicated by Fs (Hz), and let it be assumed that one sample (24-bit parallel data) of the digital tone signal (e.g., PCM waveform signal) is output per sampling cycle (DAC cycle) based on the sampling frequency. Note that, for convenience of description, a clock signal of the frequency Fs will be referred to as "sampling clock Fs".

A ΔΣ modulator 202 functions as a converter that inputs the digital tone signal and converts the digital tone signal (input waveform signal) into a one-bit signal through ΔΣ modulation. For example, the ΔΣ modulator 202 outputs a one-bit signal of 192 Fs (Hz) or 384 Fs (Hz). The ΔΣ modulation, which is a conventionally-known technique for generating a PDM-modulated one-bit signal, performs oversampling and noise shaping on the input signal to thereby output a one-bit signal (PDM signal) where amplitude value of the input signal is represented by density of a pulse train. The "one-bit signal of 192 Fs" is a signal representing an amplitude value of the original input signal by density of a pulse signal that holds a value "1" with a time length of the sampling cycle or period of the clock signal of the frequency 192 Fs (Hz) that is 192 times the sampling frequency Fs (Hz) of the original input signal. Similarly, the "one-bit signal of 384 Fs" is a signal representing an amplitude value of the original input signal by density of a pulse signal that holds a value "1" with a time length of the sampling cycle or period of the clock signal of the frequency 384 Fs(Ha) that is 384 times the sampling frequency Fs (Hz) of the original input signal. Which of the frequency 192 Fs and the frequency 384 Fs should be used depends on a designated mode. The "mode" will be described in detail hereinbelow. For convenience of description, the clock signal of the frequency 192 Fs will hereinafter be referred to as "clock signal 192 Fs", and the clock signal of the frequency 384 Fs will hereinafter be referred to as "clock signal 384 Fs".

A differential processing section 203 converts an input one-bit signal of 192 Fs or 384 Fs into differential signals consisting of a positive-phase one-bit signal OUT+ and a reverse-phase one-bit signal OUT− and outputs the converted one-bit signals OUT+ and OUT−. A control section 204 controls a pulse width of each of the one-bit signals OUT+ and OUT− (i.e., a time length of the pulse width), details of which will be described later. An analog LPF 205 in the sound system 109, which is a lowpass filter using an operational amplifier, generates an analogue signal by removing or cutting off high frequency components from the one-bit signals OUT− and OUT−. A power amplifier 206 amplifies and outputs the analogue signal.

The ΔΣ modulator 202, the differential processing section 203, the control section 204 and the analog LPF 205 together constitute a DA converter which converts a digital tone signal, generated by the tone generator section 201, into an analogue signal. Whereas the instant embodiment is described here in relation to a system of a single monaural channel, the present invention can of course be practiced also in a stereo system or multichannel system, in which case signal lines corresponding in number to the channels are required.

Figure 3:
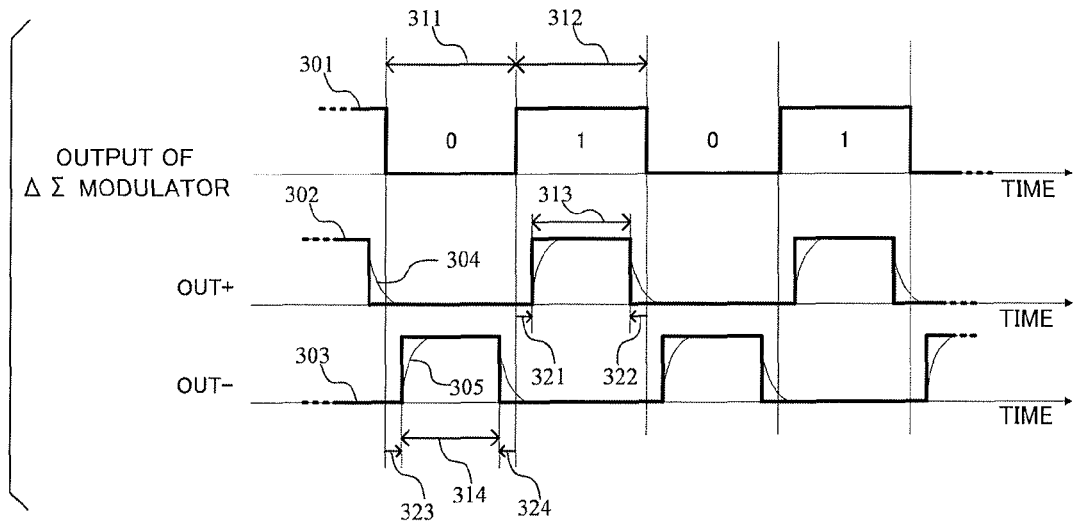
FIG. 3 is a time chart of examples of a one-bit signal and differential signals corresponding to a silent state.

FIG. 3 is a time chart of operation of the structural components of the embodiment shown in FIGS. 1 and 2 in a silent state during normal use. "during normal use" means when the embodiment is operating stably in the silent state after passage of a sufficient time following power supply ON. Reference numeral 301 indicates an output signal from the ΔΣ modulator 202 in the silent state during the normal use. This output signal from the ΔΣ modulator 202 is a signal where values "1" and "0" are output alternately at an equal ratio (with a pulse occurrence rate of 50%). Assuming that the sampling frequency Fs is 44.1 kHz and the output signal 301 is a one-bit signal of 192 Fs, a time length of a "0" period 311 and a time length of a "1" period 312 of the output signal 301 are each a cycle length (or period length) of the clock signal 192 Fs, i.e. $1/(44.1 \times 10^3 \times 192)$ seconds.

Reference numerals 302 and 303 indicate differential signals provided by the differential processing section 203 performing differential processing on the output signal 301 from the ΔΣ modulator 202; more specifically, reference numerals 302 and 303 indicate signals OUT+ and OUT− generated in the silent state during normal use. The signal OUT+302 is a signal taking a value of almost "1" in a period when the output signal 301 is taking the value "1" (see, for example, a period 313 corresponding to a period 312). The signal OUT− 303 is a signal taking a value of almost "1" in a period when the output signal 301 is taking the value "0" (see, for example, a period 314 corresponding to the period 311).

However, pulses flowing in actual signal lines as the signals OUT+ and OUT− are signals progressively decreasing and progressively increasing in value as indicated by 304 and 305 in FIG. 3. Thus, in the instant embodiment of the analog signal generation apparatus, predetermined margins (leeways or allowances) are provided such that processing based on such differential signals OUT+ and OUT− can be performed in subsequent circuits without problems. Namely, for the signal OUT+, signal margins 321 and 322 are provided immediately after the start point and immediately before the end point of the period 311 when the output signal 301 takes the value "1". For the signal OUT−, signal margins 323 and 324 are provided immediately after the start point and immediately before the end point of the period 311 when the output signal 301 takes the value "0". How much time lengths the margins should have is determined depending on the designated mode. Any one of the modes is designated by the CPU 101 or a predetermined logic circuit. Control for providing such margins, in other words control of a pulse width of the differential signals OUT+ and OUT− is performed by the control section 204.

The following describe the mode. In the instant embodiment of the analog signal generation apparatus, eight modes, i.e. Mode 0 to Mode 7, are designatable or settable selectively. The designated mode defines an operating frequency of the ΔΣ modulator 202 and the differential processing section 203 and a "ratio" that determines sizes of the margins 321 to 324 of the signals OUT+ and OUT−. The "ratio" use herein is represented by a ratio of the pulse width of the signal OUT+(i.e., the time length of the period 313 in FIG. 3) (or the pulse width of the signal OUT−) to the pulse width of the output signal of the ΔΣ modulator 202 in the silent state during the normal use, and such a ratio will hereinafter be referred to as "control ratio".

Once Mode 0 is designated, for example, the operating frequency of the ΔΣ modulator 202 and the differential processing section 203 is set at 192 Fs, and the control ratio is set at 87.5%. The control ratio 87.5% means that a ratio of "time length 314÷time length 311" and a ratio of "time length 313÷time length 312" are each adjusted to 87.5%. Once Mode 5 is designated, the operating frequency of the ΔΣ modulator 202 and the differential processing section 203 is set at 384 Fs, and the control ratio is set at 50.0%. Although not particularly described here to avoid unnecessary duplication, the operating frequency of the ΔΣ modulator 202 and the differential processing section 203 and the control ratios are predetermined for each of the other modes too.

Whereas examples of signals corresponding to the silent state are shown in FIG. 3, the pulse width of each of the differential signals OUT+ and OUT− generated in response to the tone generator section 201 generating or outputting a non-silent tone signal is adjusted on the basis of a control ratio corresponding to the currently designated mode as similar to the aforementioned examples, while the pulse occurrence rate varies in response to an amplitude value of an input waveform signal.

Normally, immediately after power supply ON, there occurs a silent state where there is no waveform signal to be generated, and thus, a one-bit signal and differential signals generated in response to energization (activation) of various circuits assume states corresponding to the silent state as shown in FIG. 3. More specifically, at that time, the output signal (e.g., one-bit signal of a 50% pulse occurrence rate) of the ΔΣ modulator 202 corresponding to the silent state as shown in FIG. 3 rises suddenly and the differential signals OUT+ and OUT− corresponding to the output signal of the ΔΣ modulator 202 also rise, so that transitory noise can occur. Thus, the instant embodiment of the invention is constructed in such a manner that, immediately after the power supply ON, the transitory noise can be suppressed using the control ratio adjusting function of the control section 204. When shutdown or turning-off of the power supply has been instructed too, transitory noise can be suppressed using the control ratio adjusting function of the control section 204.

Therefore, the instant embodiment employs the concept of "mute-on" and "mute-off" in order to control the output of the ΔΣ modulator 202 (i.e., one-bit converter). Namely, in the following description of the instant embodiment, smoothly shutting down the output of the ΔΣ modulator 202 (i.e., one-bit converter) will be referred to as "mute on", and smoothly canceling the shutdown state of the output of the ΔΣ modulator 202 will be referred to as "mute off". The non-energized state is equal to the state where the output of the ΔΣ modulator 202 (i.e., one-bit converter) is shut down, and thus, upon power supply ON, a "mute-off" process is performed in the instant embodiment to smoothly cancel the shutdown state of the output of the ΔΣ modulator 202. Further, because the output of the ΔΣ modulator 202 (i.e., one-bit converter) is shut down as the power supply is shut down, a "mute-on" process is performed in the instant embodiment to allow the output of the ΔΣ modulator 202 to be smoothly shut down.

Figure 4:
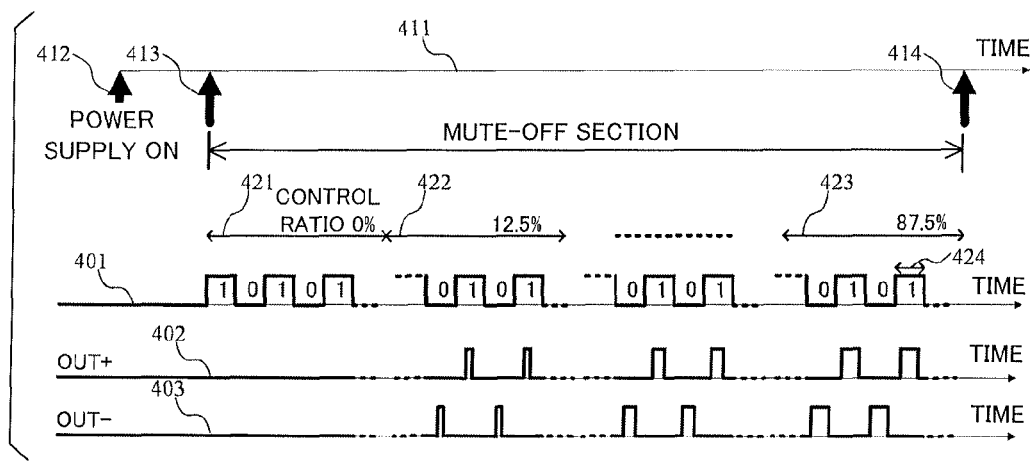
FIG. 4 is a time chart showing an example of a transitory noise suppression process performed in the instant embodiment in response to turning-on of a power supply (power supply ON)

FIG. 4 is a time chart showing an example of a transitory noise suppression process performed in the instant embodiment immediately after power supply ON. In FIG. 4, reference numeral 411 represents a direction of time progression. The various circuits are activated in response to power supply ON at a time point 412, so that the ΔΣ modulator 202 starts, at a time point 413 slightly later than the power supply ON, outputting an output signal (e.g., one-bit signal of a 50% pulse occurrence rate) corresponding to a silent state. Reference numeral 401 represents the output signal corresponding to the silent state which is the same as the signal 301 in FIG. 3. The output signal has a pulse width 424 that is 1/(Fs×192) sec. when the operating frequency is 192 Fs or 1/(Fs×384) sec. when the operating frequency is 384 Fs.

In the instant embodiment, once the output signal 401 corresponding to the silent state starts to be output from the ΔΣ modulator 202 immediately after power supply OFF, a pulse width (time length, or pulse width time length) of each of differential signals (one-bit signal OUT+ 302 and one-bit signal OUT− 303) corresponding to the output signal 401 is progressively increased, under control of the control section 204, from 0 (zero) to a target value corresponding to the silent state instead of the differential signals being immediately output with the time width corresponding to the silent state as shown in FIG. 3. The target value corresponding to the silent state is determined in accordance with the mode designated; that is, the control ratio corresponding to the designated mode determines the target value in the designated mode. Further, the number of steps (or stages) required for the gradual increase from zero to the target value corresponding to the silent state is also determined in accordance with the designated mode. When the designated mode is Mode 0, for example, the pulse width of each of the signals OUT+ and OUT− is first controlled, in the period 421 starting at the time point 413 when the output of the output signal 401 has been started, with the control ratio set 0%; that is, the pulse width (time length, or pulse width time length) of the signals OUT+ and OUT− is set at 0 (zero) in the period 421. Because the control ratio is 0% in that period, the signals OUT+ and OUT− both remain at the 0 (zero) value. In the next period 422, the pulse width of the signals OUT+ and OUT− is controlled with the control ratio set 12.5%. Then, in a manner similar to the aforementioned, the control ratio is caused to progressively approach the final or ultimate control value (i.e., target value) of 87.5% for Mode 0. Namely, the pulse width of each of the differential signals (one-bit signals OUT+ and OUT−) is progressively increased from 0 to the target value corresponding to the silent state. Reference numeral 423 indicates a period when the control value has reached 87.5% (target value). Reference numeral 414 indicates a time point at which the period 423, when the control value reached the 87.5% target value, has ended. Note that the final control value of 87.5% for Mode 0 is maintained in and after the period 423. Namely, even in the silent state, each time a tone is input and the pulse density of the signals OUT+ and OUT− varies, scaling is performed on the pulse width of each of the one-bit signals in accordance with the control ratio of 87.5%. Note that the periods 421, 422 and 423 in the aforementioned control may be set at any suitable time length in view of a desired design; in general, the periods 421, 422 and 423 are set at a relatively short time length. In a later-described example, these periods are set a time length that is 64 times the sampling period Fs. A section when the pulse width time length of the one-bit signal increases from 0 to the target value corresponding to the silent state upon power supply ON, i.e. a section from time point 413 to time point 414, is when a "mute-off" process is performed.

Figure 5:
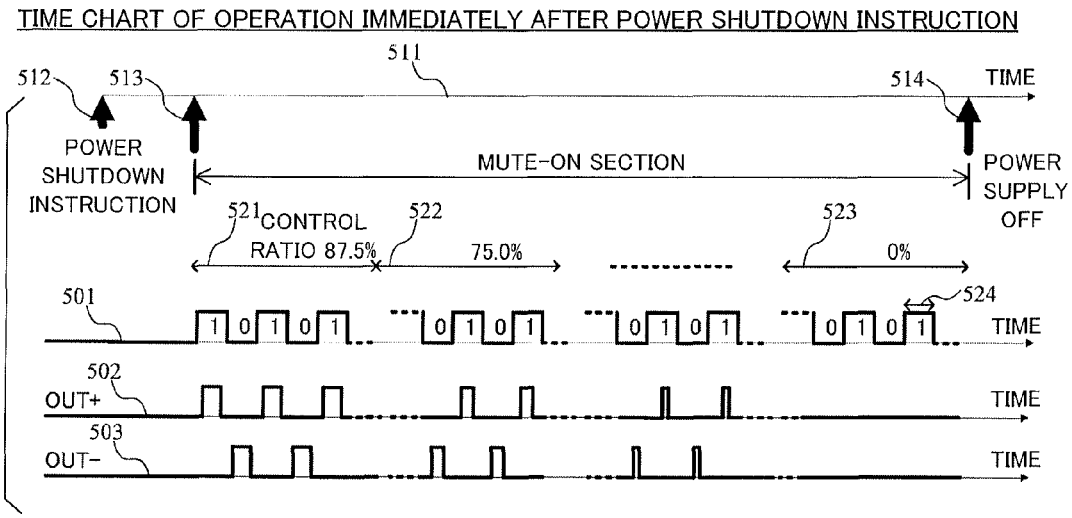
FIG. 5 is a time chart showing an example of a transitory noise suppression process performed in response to a power shutdown instruction in the embodiment.

FIG. 5 is a time chart showing an example of a transitory noise suppression process performed in response to a power shutdown (power-off) instruction in the instant embodiment. In FIG. 5, reference numeral 511 represents a direction of time progression, and let it be assumed here that a power shutdown is instructed at a time point 512. In the instant embodiment, the power supply is not turned off immediately in response to the power shutdown instruction given at the time point 512; instead, control is performed for progressively decreasing the pulse width of each of the differential signals to 0 (zero) with a period from time point 513 to time pint 514 set as a section for performing a "mute-on" process, and the power supply is turned off upon completion of the "mute-on" process. In the illustrated example of FIG. 5, the ΔΣ modulator 202 is outputting an output signal corresponding to the silent state (e.g., one-bit signal of a 50% pulse occurrence rate). Reference numeral 501 indicates the output signal corresponding to the silent state output from the ΔΣ modulator 202, which is the same as the output signal 301 shown in FIG. 3. The output signal has a pulse width 524 whose time length is 1/(Fs×192) sec. when the operating frequency is 192 Fs or 1/(Fs×384) sec. when the operating frequency is 384 Fs. The time point 513 when the "mute-on" section starts may be slightly later than the time point 512 when the power shutdown was instructed. Alternatively, however, the time point 513 may be concurrent with the shutdown instruction time point 512.

If the apparatus is in the silent state when the power supply is shut down, the ΔΣ modulator 202 is outputting the one-bit signal corresponding to the silent state, as noted above. The one-bit signal corresponding to the silent state has a relatively great pulse width, and thus, if the one-bit signal is turned off immediately, transitory noise can occur at the time of a first fall of the signal. Thus, in the instant embodiment, when the power supply is to be turned off, the section for performing the "mute-on" process is set such that the transitory noise can be suppressed by the control section 204 using the above-mentioned control ratio adjusting function to progressively decrease the pulse width (time length) of each of the differential signals (OUT+ and OUT−) from a current value to 0.

In the section for performing the "mute-on" process (mute-on section), the control ratio is controlled in a plurality of steps (or stages) from the current value to 0. The current value and the number of the steps are determined in accordance with the designated mode. For example, when Mode 0 is designated, the pulse width (time length) of each of the signals OUT+ and OUT− is controlled with the control ratio of 87.5% in the first period 521 of the "mute-on" section (i.e., the pulse width time length of each of the signals OUT+ and OUT− is maintained at the current value). In the next period 522, the control value is reduced to 75% to control the pulse width time length of the signals OUT+ and OUT− to be slightly smaller. Then, in a similar manner to the aforementioned, the control ratio is progressively reduced to progressively approach the ultimate value of 0%; that is, the control ratio is progressively reduced so that the pulse width time length of the signals OUT+ and OUT− becomes 0 (zero). Reference numeral 523 indicates a period where the control ratio has reached 0%. The power supply to the apparatus is turned off at a time point 514 when the period 523 has ended, or at a later time point. These periods 521, 522 and 523 may also be set at any suitable time length, which is generally a short time length, in view of a desired design. In a later-described example, these periods are set at a time length that is 64 times the sampling period Fs.

Figure 6:
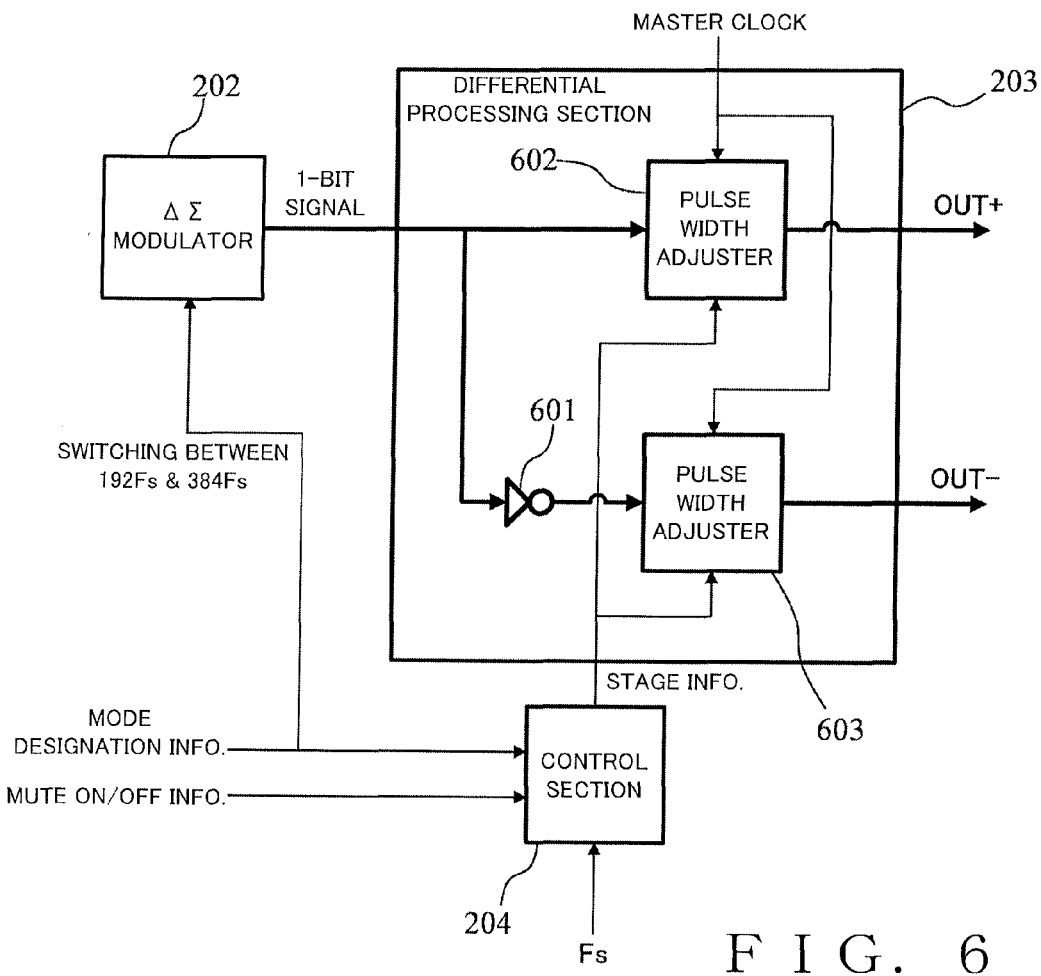
FIG. 6 is a block diagram showing detailed inner constructions of a differential processing section in the embodiment.

FIG. 6 shows detailed inner constructions of the differential processing section 203 and circuitry peripheral to the differential processing section 203. The differential processing section 203 includes an inverter 601 and pulse width adjusters 602 and 603. The ΔΣ modulator 202 inputs or receives mode designation information and performs ΔΣ modulation on the basis of the clock signal 192 Fs or 384 Fs, corresponding to the designated mode, to thereby output a one-bit signal of 192 Fs or 384 Fs. The one-bit signal output from the ΔΣ modulator 202 is input to the pulse width adjuster 602 and the inverter 601. The inverter 601 inverts "0" and "1" of the one-bit signal. The thus-inverted signal is input to the pulse width adjuster 603.

The pulse width adjuster 602 adjusts, in a stepwise fashion, the pulse width (time length) of the one-bit signal output from the ΔΣ modulator 202 on the basis of stage information output from the control section 204, so that the pulse width adjuster 602 generates and outputs a positive-phase signal OUT+. Similarly, the pulse width adjuster 603 adjusts, in a stepwise fashion, the pulse width time length of an inverted one-bit signal output from the inverter 601 on the basis of the stage information output from the control section 204, so that the pulse width adjuster 603 generates and outputs a reverse-phase signal OUT−. The pulse width adjusters 602 and 603 perform pulse width adjustment processing using a master clock signal that is generated by multiplying the sampling clock Fs by 192×8; alternatively, the master clock signal may be generated by multiplying the sampling clock Fs by 384×4. Of course, the sampling clock Fs may be generated by dividing the master clock signal.

To the control section 204 are input the mode designation information and mute on/off information output from the CPU 101 and predetermined logic circuits as well as the sampling clock Fs as an operating clock signal. The mode designation information is information that designates any one of the plurality of modes. The mute on/off information is information instructing mute-on or mute-off. The mute-on is instructed at the time point 413 in response to the power supply ON at the time point 412, and the mute-on instruction is terminated at the time point 414. The mute-off is instructed at the time point 513 in response to the shutdown instruction at the time point 512, and the mute-off instruction is terminated at the time point 514.

The control section 204 outputs stage information to the pulse width adjusters 602 and 603 such that the above-mentioned stepwise pulse width control is realized in accordance with the mode designation information and the mute on/off information. The stage information is information designating a control ratio from among nine control ratios, 0%, 12.5%, 25.0%, . . . , 87.5% and 100.0%. Stage information corresponding to the nine stages will be referred to as "Stage 0" to "Stage 7". Namely, Stage 0 instructs that the control ratio be adjusted to 0%, Stage 1 instructs that the control ratio be adjusted to 12.5%, . . . , Stage 7 instructs that the control ratio be adjusted to 87.5%, and stage 8 instructs that the control ratio be adjusted to 100.0%.

FIG. 7A shows an example of the mute-off process performed by the CPU 101 (control section 204). The mute-off process is started in response to mute-off being instructed by the mute-on/off information at predetermined timing (e.g., at the time point 413) immediately after power supply ON.

First, at step 701, the CPU 101 (control section 204) outputs, as initial stage information, Stage 0 to the pulse width adjusters 602 and 603. In accordance with the initial stage information Stage 0, the pulse width adjusters 602 and 603 each set the control ratio at 0% so that the pulse width time length of each of one-bit signals (differential signals OUT+ and OUT−) generated therein becomes 0 (zero). Thus, in the example of FIG. 4, for instance, the first period 421 is started, and differential signals OUT+ and OUT− having been adjusted by the control ratio of 0% such that the pulse width time length becomes 0 are output.

Next, the CPU 101 initializes a counter CNT to 0 (zero) at step 702, and then counts up the counter CNT at step 703. The counting-up of the counter CNT is effected per clock pulse of the sampling clock Fs, i.e. in response to the next clock pulse of the sampling clock Fs. At step 704, the CPU 101 determines whether the counter CNT has reached a predetermined value (e.g., 64). If the counter CNT has not reached the predetermined value as determined at step 704, the CPU 101 reverts to step 703 to continue with the counting-up of the counter CNT. If, on the other hand, the counter CNT has reached the predetermined value (e.g., 64) as determined at step 704, the CPU 101 proceed to step 705. Namely, the CPU 101 proceeds to step 705 once a period of a time length that is almost 64 times the sampling period elapses from the time point of step 702.

At step 705, the CPU 101 outputs the next stage information in accordance with a predetermined order corresponding to the designated mode (ascending order). Note that, in the case of Mode 0, where the control ratio is shifted in the stepwise order of 0%→12.5%→25.0%→37.5%→50.0%→62.5%→75.0%→87.5%, the stage information corresponding to the mode is shifted in the ascending stepwise order of Stage 0→Stage 1→Stage 2→Stage 3→Stage 4→Stage 5→Stage 6→Stage 7. Thus, upon arrival at step 705, the CPU 101 shifts the current stage to the next stage, i.e. Stage 1 if the current stage is Stage 0, to Stage 2 if the current stage is Stage 1, or the like. Then, at step 706, the CPU 101 determines whether or not the target stage of the current mode (e.g., Stage 7 is the target stage in the case of Mode 0) has been reached. If the target stage of the current mode has not yet been reached as determined at step 706, the CPU 101 reverts to step 702 to continue with the operation for shifting to the next stage. If the target stage of the current mode has been reached as determined at step 706, it means that a last period of a mute-off section has been reached, and thus, the mute-off process is brought to an end. In the target stage, the control ratio is set such that the pulse width time length assumes a target value corresponding to the silent state.

FIG. 7B shows an example of the mute-on process performed by the CPU 101 (control section 204). The mute-on process is started once mute-on is instructed by the mute-on/off information at predetermined timing (e.g., at the time point 513) immediately after a power shutdown instruction (i.e., operation for turning off the power switch).

Next, the CPU 101 initializes the counter CNT to 0 (zero) at step 711, and then counts up the counter CNT per clock pulse of the sampling clock Fs at step 712 as at step 702 of FIG. 7A. At step 713, the CPU 101 determines whether the counter CNT has reached a predetermined value (e.g., 64). If the counter CNT has not reached the predetermined value as determined at 713, the CPU 101 reverts to step 712 to continue with the counting-up of the counter CNT. If, on the other hand, the counter CNT has reached the predetermined value (e.g., 64) as determined at 713, the CPU 101 proceed to step 714. Namely, the CPU 101 proceeds to step 714 once a period of a time length that is almost 64 times the sampling period elapses from the time point of step 711. A first one of the periods each having the time length that is almost 64 times the sampling period is the first period 512 in FIG. 5. In the first period 512, the control value instructed by the control section 204 maintains a current value (i.e., value during normal use corresponding to the designated mode which is, for example, 87.5% in the case of Mode 0).

At step 714, the CPU 101 outputs the next stage information in accordance with a predetermined order corresponding to the designated mode (descending order). The descending order is opposite the order of the stages explained above in relation to step 705 of the mute-off process. In the case of Mode 0, for instance, the stage information corresponding to the mode is shifted at step 714 in the descending stepwise order of Stage 7→Stage 6→Stage 5→Stage 4→Stage 3→Stage 2→Stage 1→Stage 0. Then, at step 715, the CPU 101 determines whether or not Stage 0 has been reached. If Stage 0 has not yet been reached as determined at step 715, the CPU 101 reverts to step 711 to continue with the operation for shifting to the next stage. If Stage 0 has been reached as determined at step 715, it means that a last period of a mute-on section has been reached, and thus, the mute-on process is brought to an end. In the target stage or Stage 0, the control ratio is set at 0% such that the pulse width time length becomes 0 (zero).

Figure 8:
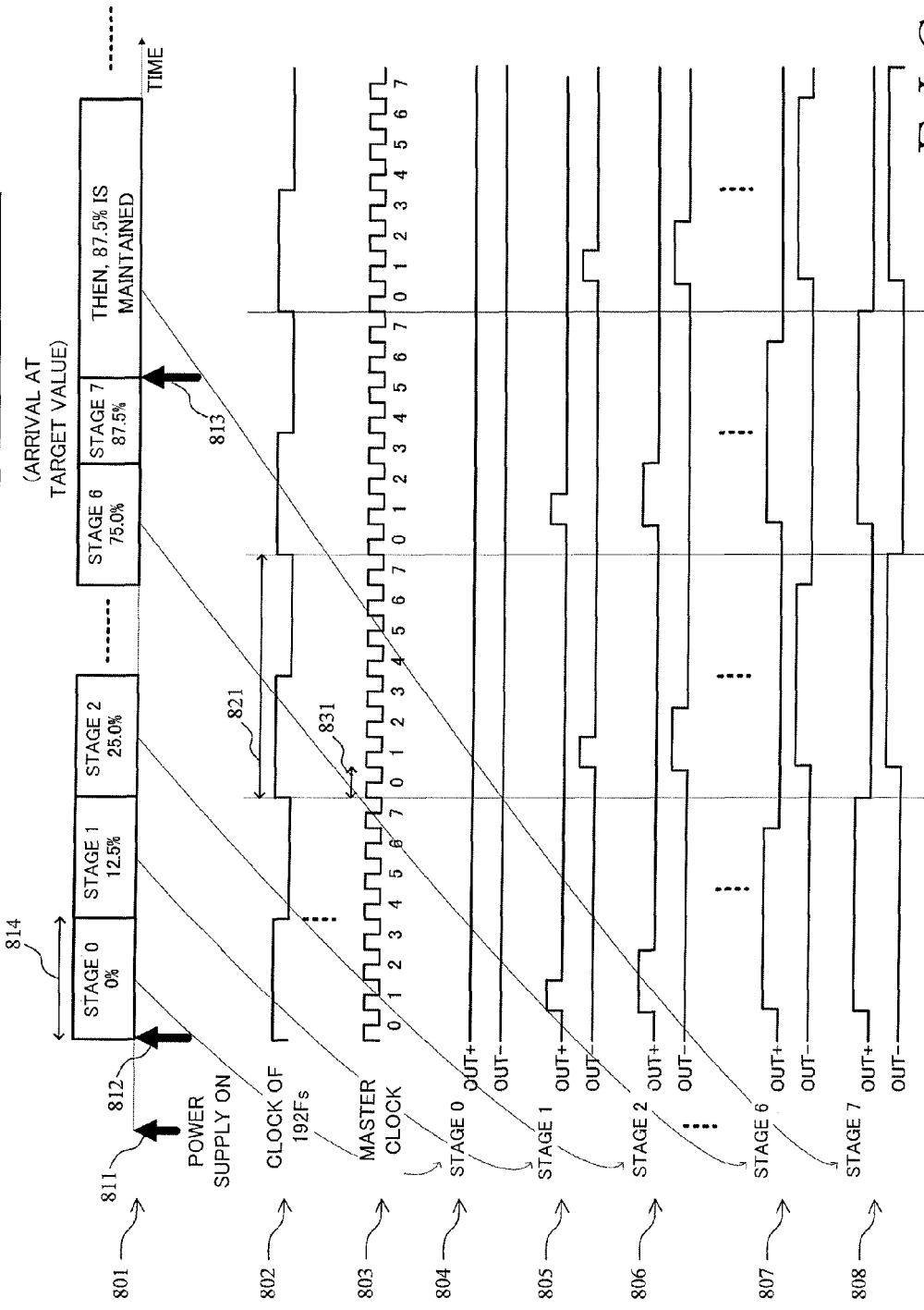
FIG. 8 is a flow chart showing stepwise control of a pulse width time length performed in response to power supply ON when a designated mode is Mode 0.

FIG. 8 shows stepwise control of the pulse width time length of the differential signals OUT+ and OUT− that is performed in response to power supply ON when Mode 0 is designated. In Mode 0, the target stage is Stage 7, and the operating frequency of the ΔΣ modulator 202 and the differential processing section 203 is 192 Fs.

Reference numeral 811 in FIG. 8 represents the passage of time, and let it be assumed here that the power supply is turned on at a time point 811. Information instructing mute-off is input to the control section 204 at a time point 812, in response to which the mute-off process shown in FIG. 7A is started. Further, in response to the power supply ON, the ΔΣ modulator 202 outputs a one-bit signal indicative of the silent state. Once the mute-off process shown in FIG. 7A is started, the stage is shifted in the stepwise order of Stage 0→Stage 1, . . . , →Stage 7 when Mode 0 is designated, as described above with reference to FIGS. 4, 6 and 7A. Reference numeral 814 indicates a period of Stage 0 that is 64 times the sampling period Fs as noted above. Periods of the other stages, Stage 1 to Stage 6, are identical in time length to the period of Stage 0. At a time point 813, Stage 7 that is the ultimate or target stage of Mode 0 is reached, the control ratio is set at 87.5%, and the pulse width time length of each of the differential signals is set at a target value corresponding to the 87.5% control ratio. The mute-off section ends at Stage 7, after which the value during normal use corresponding to Mode 0, i.e. 87.5%, is maintained.

Further, reference numerals 804 to 808 in FIG. 8 indicate, in an enlarged time scale, an example of the pulse width time length of each of the differential signals OUT+ and OUT− generated in correspondence with the individual stages, and reference numerals 802 and 803 indicate the clock signal 192 Fs and the master clock signal (whose frequency is 192 Fs×8), respectively, that function as bases for generating the differential signals of the individual stages. The period 821 of the clock signal 192 Fs is 1/192 Fs sec., and the period 831 of the master clock signal is 1/(192 Fs×8) sec.

More specifically, reference numeral 804 indicates the differential signals of Stage 0. Because the control ratio in Stage 0 is 0%, each of the signals OUT+ and OUT− is constantly kept at 0. Reference numeral 805 indicates the differential signals of Stage 1. Because the control ratio in Stage 1 is 12.5%, the pulses of the signals OUT+ and OUT− are adjusted in such a manner that a section of value "1" accounts for 12.5% of the time length 821. Similar adjustment is made for the other stages. For example, because the control ratio is 87.5% for the differential signals 808 of Stage 7, the pulses of the signals OUT+ and OUT− are each adjusted in such a manner that the section of value "1" accounts for 87.5% of the time length 821.

Figure 9:
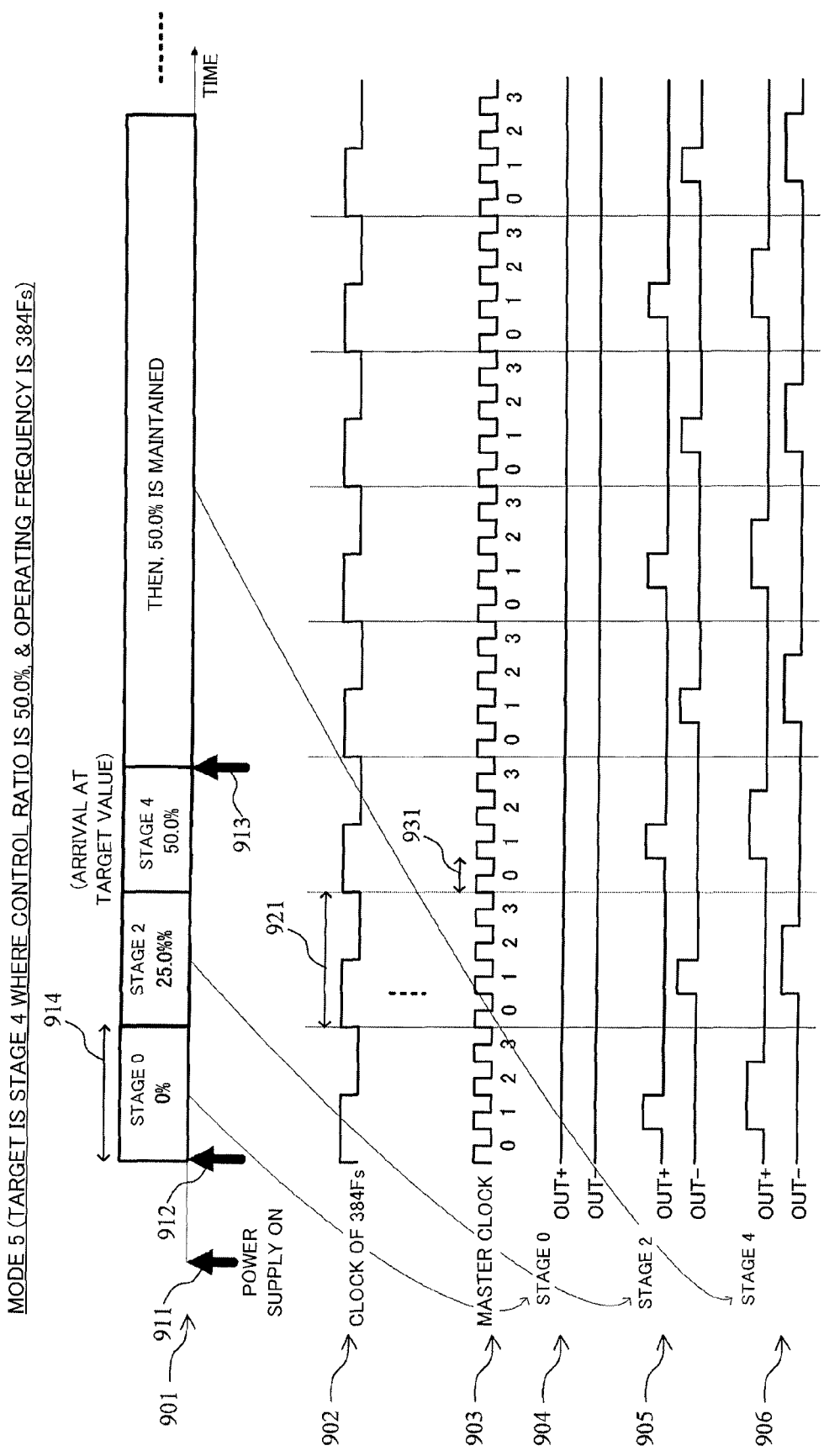
FIG. 9 is a time chart showing stepwise control of the pulse width time length when the designated mode is Mode 5.

FIG. 9 shows stepwise control of the pulse width time length of each of the differential signals OUT+ and OUT− that is performed in response to power supply ON when Mode 5 is designated. In Mode 5, the target stage is Stage 4 (where the control ratio is 50%), and the operating frequency of the ΔΣ modulator 202 and the differential processing section 203 is 384 Fs.

Reference numeral 901 in FIG. 9 represents the passage of time, and let it be assumed here that the power supply is turned on at a time point 911. Information instructing mute-off is input to the control section 204 at a time point 912, in response to which the mute-off process shown in FIG. 7A is started. Similarly to the above, in response to the power supply ON, the ΔΣ modulator 202 outputs a one-bit signal indicative of the silent state. In Mode 5, the stage is shifted in the stepwise order of Stage 0→Stage 1→Stage 4. Reference numeral 914 indicates a period of Stage 0 that is 64 times the sampling period Fs. A periods of the next stage, Stage 2, is identical in time length to the period of Stage 0. At a time point 913, Stage 4 that is the ultimate or target stage of Mode 5 is reached, the control ratio is set at 50%, and the pulse width time length of each of the differential signals is set at a corresponding target value. The mute-off section ends at Stage 4, after which the value during normal use corresponding to Mode 5, i.e. 50%, is maintained.

Further, reference numerals 904 to 906 in FIG. 9 indicate, in an enlarged time scale, an example of the pulse width time length of each of the differential signals OUT+ and OUT− generated in correspondence with the individual stages, and reference numerals 902 and 903 indicate the clock signal 384 Fs and the master clock signal (whose frequency is 384 Fs×4), respectively, that function as bases for generating the differential signals of the individual stages. The period 921 of the clock signal 384 Fs is 1/384 Fs sec., and the period 931 of the master clock signal is 1/(384 Fs×4) sec.

More specifically, reference numeral 904 in FIG. 9 indicates the differential signals of Stage 0. Because the control ratio in Stage 0 is 0%, each of the signals OUT+ and OUT− is constantly kept at 0 (zero). Reference numeral 905 indicates the differential signals of Stage 2. Because the control ratio in Stage 2 is 25.0%, the pulses of the signals OUT+ and OUT− are each adjusted in such a manner that a section of value "1" accounts for 25.0% of the time length 921. Similar adjustment is made for the other stages. For example, because the control ratio of the differential signals 906 in Stage 4 is 50.0%, the pulses of the signals OUT+ and OUT− are each adjusted in such a manner that the section of value "1" accounts for 50.0% of the time length 921.

Whereas the preferred embodiment of the invention has been described above in relation to the processing performed in response to power supply ON and power shutdown (power supply OFF), such process of the present invention may be performed other than in response to power supply ON and power supply shutdown, such as when occurrence of transitory noise is expected because of occurrence of a rapid variation in the pulse width of the one-bit signal output from the ΔΣ modulator 202 (i.e., one-bit converter). The present invention may be modified as follows. Namely, in response to one mode being changed to another, information instructing mute-on may be input to the control section 204 to cause the control section 204 to perform the mute-on process (FIG. 7B) as performed in the "mute-on" section from the time point 513 to the time point 514 of FIG. 5. Then, in response to designation of another mode, information instructing mute-off may be input to the control section 204 to cause the control section 204 to perform the mute-off process (FIG. 7A) as performed in the "mute-off" section from the time point 413 to the time point 414 of FIG. 4. There can occur a rapid variation in the control ratio in response to a change in the mode, involving transitory noise. However, performing the mute-on process (FIG. 7B) and the mute-of process (FIG. 7A) in combination as in the above-described embodiment can suppress transitory noise by smoothly shutting down the output of the ΔΣ modulator 202 (i.e., one-bit converter) (mute-on process) and then smoothly canceling the shutdown state of the output of the ΔΣ modulator 202 (mute-off process).

Further, whereas the preferred embodiment of the invention has been described above in relation to the case where the present invention is applied to the DA converter of the electronic musical instrument, the present invention is applicable to various other apparatus that use differential signals. With apparatus where a silent state is represented by positive-phase and reverse-phase pulse signals of differential signals, it is conceivable that, upon power supply ON, such differential signals would appear to induce noise internally. However, application of the present invention can prevent such noise. For example, the present invention can also be applied to a one-bit switching amplifier.

Furthermore, whereas the preferred embodiment of the invention has been described above in relation to the case where the "predetermined value" at step 704 of FIG. 7A and at step 713 of FIG. 7B is "64", i.e. where the time length of each of the stages is 64 times the sampling period, the time length of each of the stages is not so limited. The stages may be different from one another in time length, or the stages may have time lengths corresponding to the modes.

Furthermore, whereas the preferred embodiment of the invention has been described above as performing, as processing immediately after turning-on of the power supply, control for progressively increasing the pulse width of each of the signals OUT+ and OUT− from 0 (zero) to the target time length while the ΔΣ modulator 202 is outputting the one-bit signal corresponding to the silent state, the present invention is not so limited. For example, the ΔΣ modulator 202 may immediately start outputting a one-bit signal corresponding to some kind of non-silent state, and the control for progressively increasing the pulse width of each of the signals OUT+ and OUT− from 0 (zero) to the target time length may be performed while the ΔΣ modulator 202 is outputting the one-bit signal corresponding to the non-silent state. Furthermore, whereas the preferred embodiment of the invention has been described above as performing, as processing after a power shutdown instruction, control for progressively decreasing the pulse width of each of the signals OUT+ and OUT− to 0 (zero) while the ΔΣ modulator 202 is outputting the one-bit signal corresponding to the silent state, the present invention is not so limited, and for example, the control for progressively decreasing the pulse width of the signals OUT+ and OUT− to 0 (zero) may be performed while the ΔΣ modulator 202 is outputting a one-bit signal corresponding to a non-silent state.

Furthermore, whereas the preferred embodiment of the invention has been described above as generating a one-bit signal modulated in accordance with the PDM (Pulse Density Modulation) scheme using the ΔΣ modulator as a one-bit converter, the present invention is not so limited, and the present invention may employ a one-bit converter which outputs a one-bit signal in accordance with another pulse modulation scheme, such as the PWM (Pulse Width Modulation) scheme. Namely, an amplitude value may be represented by widths of pulses OUT+ and reverse-phase pulses OUT− that are generated at predetermined time intervals, and the signals OUT+ and OUT− may be each progressively increased from the pulse width time length of 0 (zero) to the target value corresponding to the amplitude value in the mute-off process and progressively decreased from a current value corresponding to the respective amplitude value to 0 (zero).

This application is based on, and claims priority to, JP PA 2014-263636 filed on 25 Dec. 2014. The disclosure of the priority application, in its entirety, including the drawings, claims, and the specification thereof, are incorporated herein by reference.

What is claimed is:

1. An analog signal generation apparatus comprising:
   a converter configured to convert an input waveform signal into a one-bit signal;
   a control section configured to, in response to a mute-off instruction, control a pulse width time length of the one-bit signal, output from said converter, to progressively increase from zero to a target value; and
   a filter configured to convert the one-bit signal, controlled by said control section, into an analog signal.

2. The analog signal generation apparatus as claimed in claim 1, which further comprises a differentiating section configured to convert the one-bit signal, output from said converter, into differential signals consisting of a positive-phase signal and a reverse-phase signal, and
   wherein said control section progressively increases a pulse width time length of each of the differential signals from zero to the target value.

3. The analog signal generation apparatus as claimed in claim 1, wherein the mute-off instruction is given in response to turning-on of a power supply.

4. The analog signal generation apparatus as claimed in claim 1, wherein said control section further controls, in response to a mute-on instruction, the pulse width time length of the one-bit signal, output from said converter, to progressively decrease from a current value to zero.

5. The analog signal generation apparatus as claimed in claim 4, which further comprises a differentiating section configured to convert the one-bit signal, output from said converter, into differential signals consisting of a positive-phase signal and a reverse-phase signal, and
   said control section progressively decreases a pulse width time length of each of the differential signals from the current value to zero.

6. The analog signal generation apparatus as claimed in claim 5, wherein said control section increases or decreases, in a stepwise fashion, the pulse width time length of each of the positive-phase signal and the reverse-phase signal.

7. The analog signal generation apparatus as claimed in claim 4, wherein the mute-on instruction is given in response to a power supply OFF instruction, and a power supply is actually turned off after the pulse width time length is controlled by said control section to become zero.

8. The analog signal generation apparatus as claimed in claim 1, which further comprises a mode designation section configured to designate one of a plurality of modes, and
   wherein the target value is determined in accordance with the mode designated by said mode designation section.

9. The analog signal generation apparatus as claimed in claim 1, wherein said converter comprises a $\Delta\Sigma$ modulator.

10. The analog signal generation apparatus as claimed in claim 1, wherein said filter comprises a lowpass filter.

11. An analog signal generation apparatus comprising:
    a converter configured to convert an input waveform signal into a one-bit signal;
    a control section configured to, in response to a mute-on instruction, control a pulse width time length of the one-bit signal, output from said converter, to progressively decrease from a current value to zero; and
    a filter configured to convert the one-bit signal, controlled by said control section, into an analog signal.

12. The analog signal generation apparatus as claimed in claim 11, which further comprises a differentiating section configured to convert the one-bit signal, output from said converter, into differential signals consisting of a positive-phase signal and a reverse-phase signal, and
    wherein said control section progressively decreases a pulse width time length of each of the differential signals from the current value to zero.

13. The analog signal generation apparatus as claimed in claim 11, wherein the mute-on instruction is given in response to a power supply OFF instruction, and a power supply is actually turned off after the pulse width time length is controlled by said control section to become zero.

14. A method for, based on a one-bit signal indicative of a waveform signal, generating an analog signal indicative of the waveform signal, said method comprising:
    a step of inputting the one-bit signal indicative of the waveform signal;
    a control step of, in response to a mute-off instruction, progressively increasing a pulse width time length of the one-bit signal, input via the step of inputting, from zero to a target value; and
    a step of generating the analogue signal by filtering the one-bit signal controlled by said control step.

15. The method as claimed in claim 14, which further comprises a step of converting the one-bit signal into differential signals consisting of a positive-phase signal and a reverse-phase signal, and
    wherein said control step progressively increases a pulse width time length of each of the differential signals from zero to the target value.

16. The method as claimed in claim 14, wherein the mute-off instruction is given in response to turning-on of a power supply.

17. The method as claimed in claim 14, wherein said control step further progressively decreases, in response to a mute-on instruction, the pulse width time length of the one-bit signal, input via the step of inputting, from a current value to zero.

18. The method as claimed in claim 17, wherein the mute-on instruction is given in response to a power supply OFF instruction, and a power supply is actually turned off after the pulse width time length is controlled by said control step to become zero.

19. A method for, based on a one-bit signal indicative of a waveform signal, generating an analog signal indicative of the waveform signal, said method comprising:
    a step of inputting the one-bit signal indicative of the waveform signal;
    a control step of, in response to a mute-on instruction, progressively decreasing a pulse width time length of the one-bit signal, input via the step of inputting, from a current value to zero; and
    a step of converting the one-bit signal, controlled by said control step, into the analog signal.

20. The method as claimed in claim 19, which further comprises a step of converting the one-bit signal into differential signals consisting of a positive-phase signal and a reverse-phase signal, and
    wherein said control step progressively increases a pulse width time length of each of the differential signals from the current value to zero.

21. The method as claimed in claim 19, wherein the mute-on instruction is given in response to a power supply OFF instruction, and a power supply is actually turned off after the pulse width time length is controlled by said control step to become zero.

* * * * *